United States Patent [19]

Ohnishi et al.

[11] 4,337,518

[45] Jun. 29, 1982

[54] RECURSIVE-TYPE DIGITAL FILTER WITH REDUCED ROUND-OFF NOISE

[75] Inventors: Makoto Ohnishi, Tokyo; Hiroshi Kuwahara; Narimichi Maeda, both of Kodaira, all of Japan

[73] Assignee: Hitachi, Ltd., Tokyo, Japan

[21] Appl. No.: 172,947

[22] Filed: Jul. 28, 1980

Related U.S. Application Data

[63] Continuation of Ser. No. 937,978, Aug. 30, 1978, abandoned.

[30] Foreign Application Priority Data

Feb. 15, 1978 [JP] Japan .................................. 53-15397

[51] Int. Cl.$^3$ .............................................. G06F 7/38
[52] U.S. Cl. .................................... 364/724; 364/745
[58] Field of Search .............................. 364/724, 745

[56] References Cited

U.S. PATENT DOCUMENTS 3,777,130  12/1973  Crorsier et al. ...................... 364/724
3,982,112  9/1976   Schlereth ........................ 364/724 X
4,034,196  7/1977   Butterweck et al. ................ 364/745

*Primary Examiner*—David H. Malzahn

*Attorney, Agent, or Firm*—Craig and Antonelli

[57] ABSTRACT

A recursive-type digital filter comprising a calculation circuit. The calculation circuit is arranged to multiply an input signal including at least m-bit signal $x_n$ inputted at a predetermined sampling period and an output signal $y_{n-k}$ fed back to the input of the calculation circuit in accordance with the input signal $x_n$ after being subjected to a delay of k sampling periods by $a_k$ and $b_k$ coefficients corresponding to the filter characteristics, respectively, and then the products are added thereby to produce data $y_n$ of (m+1) bits satisfying, $$y_n = \sum_{k=0}^{M} a_k x_{n-k} + \sum_{k=1}^{N} b_k \cdot y_{n-k}$$

and serially deliver the upper m-bit data of the data $y_n$ as an output signal corresponding to the input signal $x_n$.

The filter further comprises a delay circuit for feeding back to the input of the calculation circuit a part of the round off data including the upper (m+1)th bit of the data $y_n$ so that the $b_k$ coefficient is multiplied by the fedback data of the upper (m+1)th bit and the product is added to the data $y_n$, thereby to produce an output signal with reduced round off noise.

9 Claims, 7 Drawing Figures

RECURSIVE-TYPE DIGITAL FILTER WITH REDUCED ROUND-OFF NOISE

This is a continuation of application Ser. No. 937,978, filed Aug. 30, 1978, now abandoned.

This invention relates to a digital filter (called DF hereinafter), and more particularly to a recursive-type DF.

With recent development of semiconductor technology, the use of DF has been highlighted in place of analog filters. The DF digitally performs delaying, coefficient multiplication, addition and subtraction of the digital signal to deliver the digital output signal, and various types of DF are available. For example, U.S. Pat. No. 3,777,130 entitled "Digital Filter for PCM Encoded Signals" discloses a DF (generally called combinatorial type DF) using a memory for effecting the coefficient multiplication.

The DF is classified into a recursive-type DF (called RDF hereinafter) and a transversal-type DF (called TDF hereinafter) depending on its construction. Now, letting $x_n$ denote the digital input signal at the n-th sampling point and $y_n$ denote the digital output signal, the RDF carries out the following operation:

$$y_n = \sum_{k=0}^{M} a_k \cdot x_{n-k} + \sum_{k=1}^{N} b_k \cdot y_{n-k} \quad (1)$$

where n represents a natural number, $a_k$ and $b_k$ coefficients with $a_M, b_N \neq 0$, M an order of the numerator of the transfer function of the RDF, and N an order of the denominator thereof. In this case, M-th order/N-th order indicates an order of the RDF.

In such an RDF, the S/N ratio of the digital output signal is deteriorated by round off noise and overflow and has usually a value of 25 to 30 dB which corresponds to 4 to 5 operation bits.

A typical measure to solve the deterioration of S/N ratio may include increasing the bit length of the register as a delay element in the output signal feedback loop to an amount that cancels out the overflow and round off noise. However, the RDF generally employs the serial calculation system in which delay elements are arranged serially and timing consideration restricts the selective length of data to a power of 2 with the result that doubling the data length leads to considerable increase in the number of component logical elements. On the other hand, if the data length is kept clear of the power of 2, it is necessary to change the clock rate on the input and output sides of the RDF, making the timing extremely complicated and eventually resulting in the increase in the number of component elements.

An object of this invention is to provide an RDF (Recursive-type Digital Filter) for treating serial digital input/output signal which increases the data length in the feedback loop without changing the clock rate to prevent the overflow and decrease the round off noise, thereby improving the S/N ratio of the RDF.

According to this invention, in order to attain this object, there is provided the above-mentioned RDF which is arranged to feedback m-bits of delayed digital output signal corresponding to the m-bits data length digital input signal and at the same time, delay and feedback in parallel at least a partial signal of a digital output signal other than the m-bits digital output signal contained in the digital signal multiplied by coefficient weights of l bits. It is meant herein by the serial digital input/output signal that the input signal to the RDF consists of successive binary digital signals and the output signal delivered from the RDF and fedback in the feedback loop also consists of successive binary digital signals.

Thus, according to the invention, in an RDF comprising an input terminal serially receiving a digital input signal $x_n$ of m bits, an output terminal serially delivering a digital output signal $y_n$ of m bits satisfying the following equation, $$y_n = \sum_{k=0}^{M} a_k \cdot x_{n-k} + \sum_{k=1}^{N} b_k \cdot y_{n-k}$$

where m and n represent natural numbers, $a_k$ and $b_k$ coefficients with $a_M, b_N \neq 0$ and M and N orders, delay elements for delaying $x_{n-k}$ and $y_{n-k}$ by one sampling period to produce $x_{n-k-1}$ and $y_{n-k-1}$. Further there is provided a means for multiplying $x_{n-k}$ and $y_{n-k}$ by coefficients $a_k$ and $b_k$ corresponding thereto, and means for adding outputs of the coefficients multiplying means, there is provided, in parallel with the feedback line for $y_{n-k-1}$ delayed through the delay element, a feedback line for delaying and feeding back at least a partial signal of digital output other than the m-bits digital output signal contained in the digital output signal of the adding means.

When delaying and feeding back in parallel at least the partial signal of the digital output other than the m-bits digital output signal, this partial signal may be fedback through a single feedback loop or through more than two parallel feedback loops.

Other objects and many attendant advantages of the invention will become apparent from a reading of the following detailed description together with the accompanying drawings.

Prior to describing preferred embodiments of the invention, a description of a combinatorial type RDF of 2nd order/2nd order will first be given with reference to FIG. 1. In the figure, thin arrows and thick arrows are illustrative of serial data flows and parallel data flows, respectively. A digital information input signal $x_n{}^j$, which results from sampling of an analog signal and conversion thereof into a group of binary signals, is received at an input terminal. Delay circuits 1 and 2 comprise, for example, shift registers to constitute serial delay elements which delay the signal $x_n{}^j$ ($x_n{}^j$ representing a value of j-th bit of an input signal data $x_n$) by one sampling period in order to obtain j-th bits of input signals $x_{n-1}{}^j$ and $x_{n-2}{}^j$. Herein, let the $x_n$ representative of individual sampled values of the input signal be expressed by using the 2's complement as follows:

$$x_n = -x_n^o + \sum_{j=1}^{m-1} x_n^j \cdot 2^{-j} \qquad (2)$$

where $x_n^j = 0$ or 1, $x_n^o$ represents the sign bit and m represents the number of bits of the sampled value. By combining equation (2) with equation (1), and $M = N = 2$ for this case, it follows that $$y_n = \sum_{k=0}^{2} a_k \cdot x_{n-k} + \sum_{k=1}^{2} b_k \cdot y_{n-k} \qquad (3)$$

$$= -a_0 x_n^o - a_1 x_{n-1}^o - a_2 x_{n-2}^o - b_1 y_{n-1}^o - b_2 y_{n-2}^o +$$

$$\sum_{j=1}^{m-1} (a_0 x_n^j + a_1 x_{n-1}^j + a_2 x_{n-2}^j + b_1 y_{n-1}^j +$$

$$b_2 y_{n-2}^j) \cdot 2^{-j}$$

$$= -\phi(x_n^o, x_{n-1}^o, x_{n-2}^o, y_{n-1}^o, y_{n-2}^o) +$$

$$\sum_{j=1}^{m-1} (x_n^j, x_{n-1}^j, x_{n-2}^j, y_{n-1}^j, y_{n-2}^j) \cdot 2^{-j}$$

where $(x_n, x_{n-1}, x_{n-2}, y_{n-1}, y_{n-2})$ (4)

$$= a_0 x_n + a_1 x_{n-1} + a_2 x_{n-2} + b_1 y_{n-1} + b_2 y_{n-2}$$

$$= a_0 p^1 + a_1 p^2 + a_3 p^3 + b_1 p^4 + b_2 p^5$$

Figure 1:
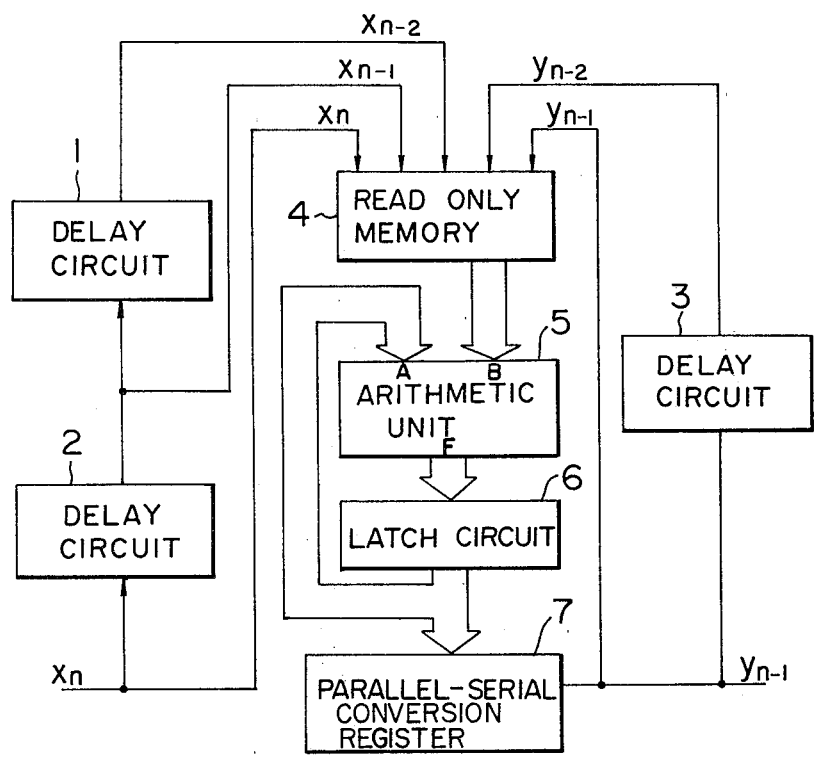
FIG. 1 shows a schematic circuit of a prior art combinatorial type RDF.

Specifically, values of $\phi$ are written into a memory 4 as shown in FIG. 1 in the form of a read only memory (ROM) and read out therefrom by addressing $P^1$ to $P^5$. In other words, $\phi$ may be read out by using addresses $P^1$, $P^2$, $P^3$, $P^4$ and $P^5$ which correspond to $x_n^j$, $x_{n-1}^j$, $x_{n-2}^j$, $y_{n-1}^j$ and $y_{n-2}^j$, respectively. As passed through a delay circuit 3, $y_{n-1}^j$ is delayed to form $y_{n-2}^j$.

Since the LSB (least significant bit) of the input data $x_n^j$ is received initially, a value of $\phi^{m-1}$ of the $\phi$ is read out initially. This value is applied to one input terminal B of an arithmetic unit (ALU)5 and returned to the other input terminal A of the ALU5 through a latch circuit (LATCH)6 at which it is delayed one bit time. By delaying the input on the input terminal B one bit foward the LSB, multiplication by $2^{-1}$ is performed. At this clocking time, ALU5 receives an output of $\phi^{m-2}$ from ROM4 and delivers an output as expressed by $\phi^{m-2} + 2^{-1} \cdot \phi^{m-1}$. After similar operations are repeated (m−1) times, the result is subtracted by the sign bit, reducing to $$-\phi^o + \sum_{j=1}^{m-1} 2^{-j} \cdot \phi^j.$$

Then, higher m bits are passed through a parallel-serial conversion register (PS)7 to be converted into a serial data, producing an output data of $y_{n-1}$. Of course, ALU5 and LATCH6 have the length of bits which is larger than m. As passed through the delay circuit 3 in the form of a serial delay element such as a shift register, the output of PS7 is delayed one sampling period to produce a signal data of $y_{n-2}^j$.

To determine the affect of the round-off noise in the RDF, a calculation will now be carried out. From equation (1), and $M = N = 2$, a quadratic transfer function $H(Z)$ expressed as, $$H(Z) = \frac{a_o + a_1^{z-1} + a_2^{z-2}}{1 - b_1 z^{-1} - b_x^{z-2}} = \frac{A(Z)}{1 - B(Z)}$$

will be obtained.

Figure 2:
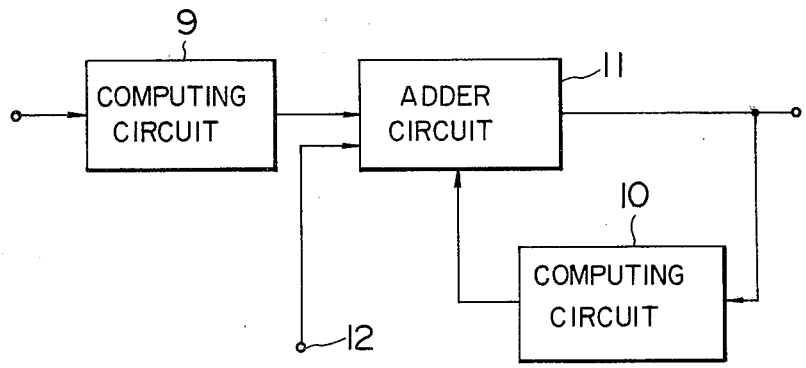
FIG. 2 shows an equivalent circuit for explaining the signal to noise ratio in the circuit shown in FIG. 1.

As will be seen from the operational description with reference to FIG. 1, the round off noise occurring when the calculation of the numerator polynomial is executed affects only one bit of the LSB and is not amplified whereas only the round off noise occurring when executing the calculation of reciprocal of the denominator polynomial is amplified. Accordingly, when taking the noise characteristic into account, an equivalent circuit of the RDF shown in FIG. 1 will be established as shown in FIG. 2. The equivalent circuit as shown therein comprises a circuit 9 for computing the numerator polynomial A(Z) of equation (5), a circuit 10 for computing the term $B(Z) = b_1 z^{-1} + b_2 z^2$ which corresponds to the denominator polynomial of equation (5) removed of the constant term of 1 (one), an adder circuit 11, and an input terminal receiving random noise equivalent to the round off noise. Accordingly, when letting a variance of the round off noise be $\rho_N$, a Z transform of the input signal $x_n$ be X and a Z transform of the output signal $y_n$ be Y, $$B(Z) \cdot Y + \sigma_N + A(Z) \cdot X = Y \qquad (6)$$

stands, reducing to $$Y = \frac{A(Z)}{1 - B(Z)} \cdot X + \frac{1}{1 - B(Z)} \cdot \sigma_N. \qquad (7)$$

In equation (7), the first term designates an ideal filter transfer characteristic free from the round off noise and the second term designates a transfer characteristic by which the round off noise affects the output signal. Thus, the S/N ratio of the RDF filter is usually decreased by the round off noise to a value of 25 to 30 dB which correspond to 4 to 5 bits.

Figure 3:
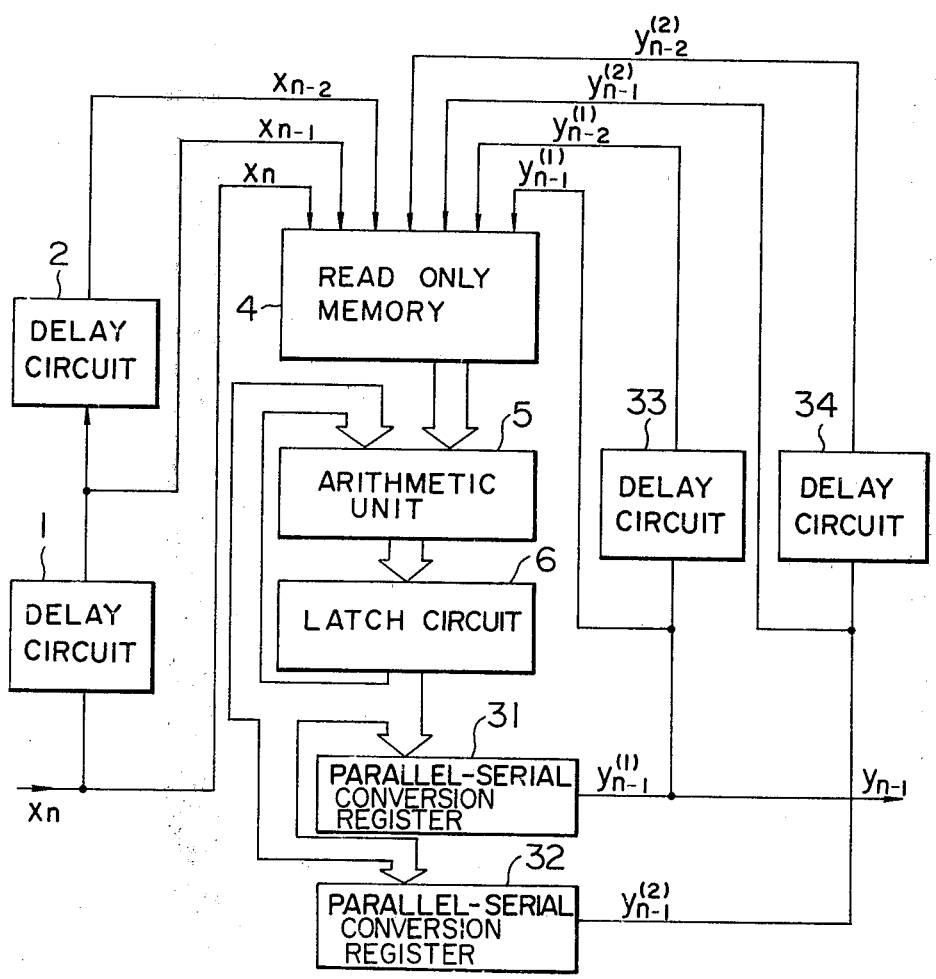
FIG. 3 shows a schematic circuit of an embodiment in accordance with the invention.

The invention will now be described by way of embodiments. In a first embodiment shown in FIG. 3, the invention is applied to a 2nd order/2nd order combinatorial type RDF. In FIG. 3, the same components as those of FIG. 1 are designated by the same reference numerals. Differing from FIG. 1, the output data of LATCH6 is obtained by parallel-serial conversion registers (PSs) 31 and 32 and a serial type data is delivered from PS31 and PS32. The PS31 fetches higher bits of the output data and the PS32 obtains lower bits thereof. Outputs from PS31 and PS32 are received by serial type one cycle delay circuits 33 and 34, respectively.

It is now assumed that an input data $x_n$ is represented by m bits and coefficients $a_0$, $a_1$, $a_2$, $b_1$ and $b_2$ are represented by l bits. With the construction of FIG. 3, it is possible for an output data of $y_{n-1}$ to take 2m bits at the most without changing timing. Thus, the 2m-bits output data in accordance with this embodiment is expressed by using the 2's complement as follows:

$$y_n = -y_n^o + \sum_{j=1}^{2m-1} 2^{-j} \cdot y_n^j \qquad (8)$$

Equation (8) reduces to equation (9) which corresponds to equation (3):

$$y_n = \sum_{j=1}^{m-1} 2^{-j} \cdot \phi^j(x_n^j, x_{n-1}^j, x_{n-2}^j, y_{n-1}^j, y_{n-1}^{m+j}, y_{n-2}^j, y_{n-2}^{m+j}) - \quad (9)$$

$$\phi(x_n^o, x_{n-1}^o, x_{n-2}^o, y_{n-1}^o, -y_{n-1}^m, y_{n-2}^o, -y_{n-2}^m),$$

where $$\phi(q_1, q_2, q_3, q_4, q_5, q_6, q_7) = a_0 q_1 + a_1 q_2 + a_3 q_3 + \quad (10)$$
$$b_1(q_4 + 2^{-m} q_5) + b_2(q_6 + 2^{-m} q_7).$$

As will be seen from equation (10), it is possible to obtain the output $y_{n-1}$ by reading out the function $\phi$, determinable by multiplication coefficients, in accordance with data $q_1$ to $q_7$ and multiplying by $2^{-1}$ and adding the results. In other words, the round off noise can be eliminated by writing the aforementioned $\phi$ into ROM4.

Generally, PS32 and PS31 are not always required to have the same length of bits but are required to have a number or length of bits sufficient to suppress the round off noise. Correspondingly, the number of bits of the delay circuit 34 may be decreased as required.

In order to apply this embodiment to a 2nd order/1st order combinatorial type RDF, one sampling period delay circuits 33 and 34 are omitted along with their output feedback lines and memory contents of ROM4 are changed. In such an application, the length of data necessary for feeding back the round-off portion of the digital output signal may be determined as desired. In addition, the number of bits which are shifted in series is the same as that of the prior art RDF so that it is not necessary to change the timing.

Figure 4:
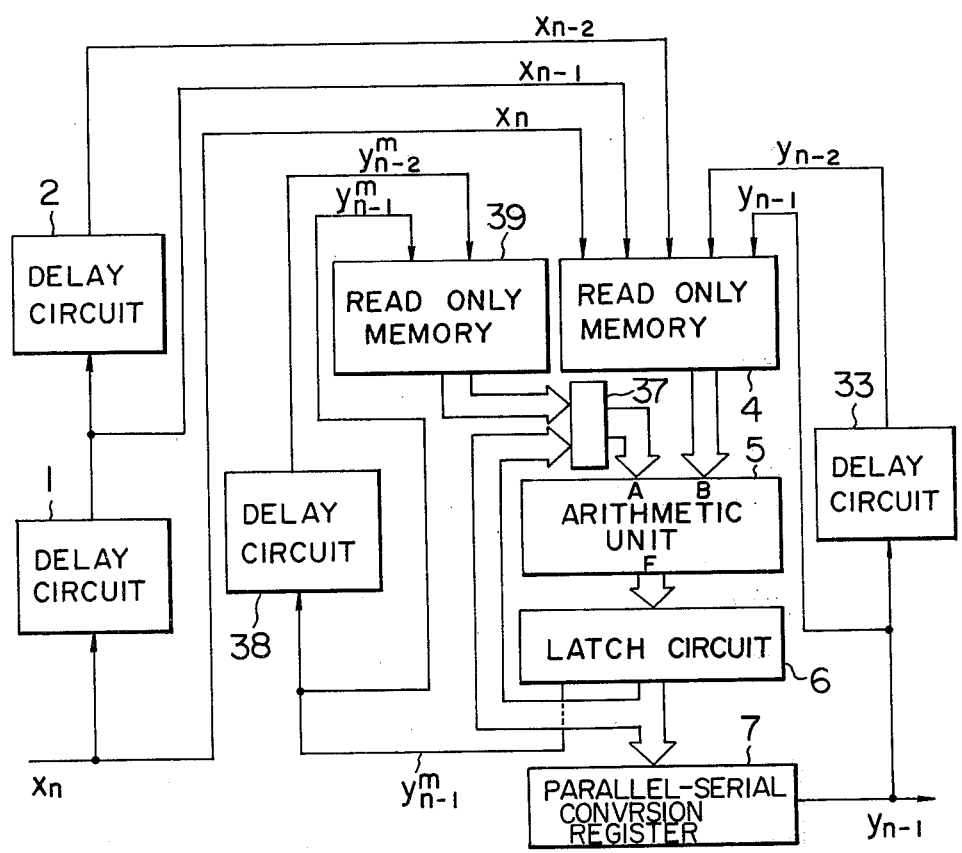
FIG. 4 shows a schematic circuit of another embodiment in accordance with the invention.

Referring to FIG. 4, another embodiment will be described in which the invention is applied to a 2nd order/2nd order combinatorial type RDF. In FIG. 1, the same reference numerals are used to designate the same components as those of FIG. 1. This embodiment adds to a delay register 38, an additional second ROM39, and a signal switching gate 37. This embodiment intends to increase the number of the feedback data by one bit.

As has been described with reference to FIG. 1, the prior art combinatorial type RDF causes, in synchronism with the initial clock, the output $\phi^{m-1}$ of ROM to be fed to one input terminal B of ALU5 but no input to be fed to the other input terminal A. If the input terminal A receives $\phi^m$ at this instant, the number of feedback data will be increased by one bit. To this end, a data $y_{n-1}^m$ which is contained in the final output from the LATCH6 and not delivered to a register 7 is picked up and fed to the delay register 38 in the same manner as the $y_{n-1}$ is done, thus producing a $y_{n-2}^m$ which in turn is fed to the ROM39 along with the $y_{n-1}^m$. Since, of data in ROM4, a $\phi'$ related only to $y_{n-1}$ and $y_{n-2}$ has previously been written into the ROM39, the $\phi'$ is expressed as, $$\phi'(y_{n-1}, y_{n-2}) = -b_1 y_{n-1} - b_2 y_{n-2} \quad (11)$$

The output of ROM39 is fed to the input terminal A of ALU5 by way of the signal switching gate 37 only at the timing of the initial clock. At the timing of the next clock, the gate 37 is switched to apply the signal from the LATCH6 to the ALU5. In this manner, ALU5 delivers the final output expressed as, $$y_n = -\phi^o + \sum_{j=1}^{m-1} 2^{-j} \cdot \phi^j + 2^{-m} \phi^1 \quad (12)$$

$$= -y_n^o + \sum_{j=1}^{m} 2^{-j} \cdot y_n^j$$

where $y_n^m = -b_1 y_{n-1}^m - b_2 y_{n-2}^m$. As a result, the number of feedback data can be increased by one bit without changing the clock rate. In addition, since it is sufficient for the delay register 38 to have one bit and for ROM39 to have a small capacity, increase in the number of component elements can be minimized in accordance with this embodiment.

Figure 5:
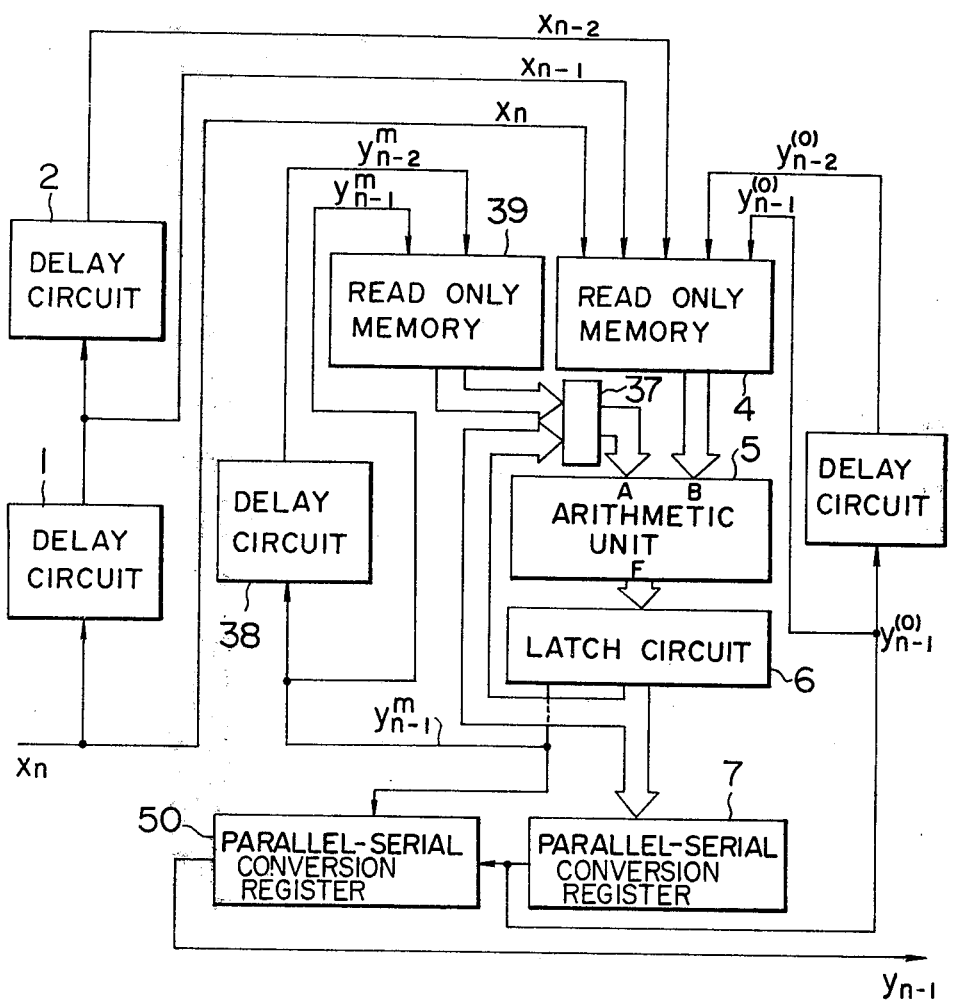
FIG. 5 shows a schematic circuit of still another embodiment in accordance with the invention.

Referring to FIG. 5, there is shown a schematic circuit of a third embodiment in which the invention is applied to a 2nd order/2nd order combinatorial type RDF. This embodiment is featured by the increase in the feedback data by one bit and the prevention of overflow based on bit shift. In FIG. 5, the same reference numerals are used to designate the same components as those of FIGS. 3 and 4. An additional one bit parallel-serial conversion register 50 (hereinafter termed PS50) fetches one bit parallel feedback data. Calculation results delivered from ALU5 are held in LATCH6, and higher bits $y_{n-1}^o$ to $y_{n-1}^{m-1}$ as shown in FIG. 6(b) (hereinafter represented by $y_{n-1}^{(o)}$) are fetched by PS7 while the LSB one bit $y_{n-1}^m$ being fetched by PS50. Constructionally, the PS50 is the same as PS7 and has its serial input terminal connected to the serial output terminal of PS7.

Figure 6:
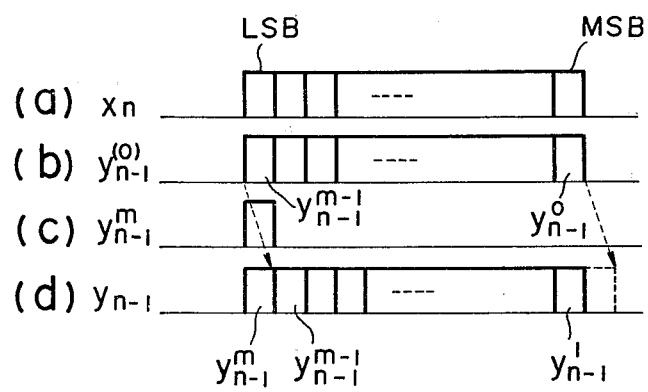
FIG. 6 shows a time chart of the digital signals in the schematic circuit shown in FIG. 5.

With this construction, as shown in a time chart of FIG. 6, the output $y_{n-1}$ (FIG. 6(d)) of the RDF with the heading LSB one bit $y_{n-1}^m$ (FIG. 6(c)) and with subsequent bits $y_{n-1}^{m-1}$ to $y_{n-1}^1$ is delivered out externally of the RDF. The MSB output data is fedback within the RDF and not delivered out externally thereof. However, without occurrence of overflow, the output data of RDF is confined within a bit range not exceeding $y_{n-1}^1$ bit, raising no problems. In the event that the overflow occurs, the external delivery of output data suffers the overflow whereas the internal feedback output data having the increment of one bit data prevents the overflow within the RDF. While this embodiment has been described as having the increased data length for preventing the one bit overflow, it should be noted that prevention of the overflow of several bits can be attained with extreme ease. It is also possible to employ in combination MSB side bits for preventing the overflow and data length of LSB side bits for suppressing the round off noise.

Figure 7:
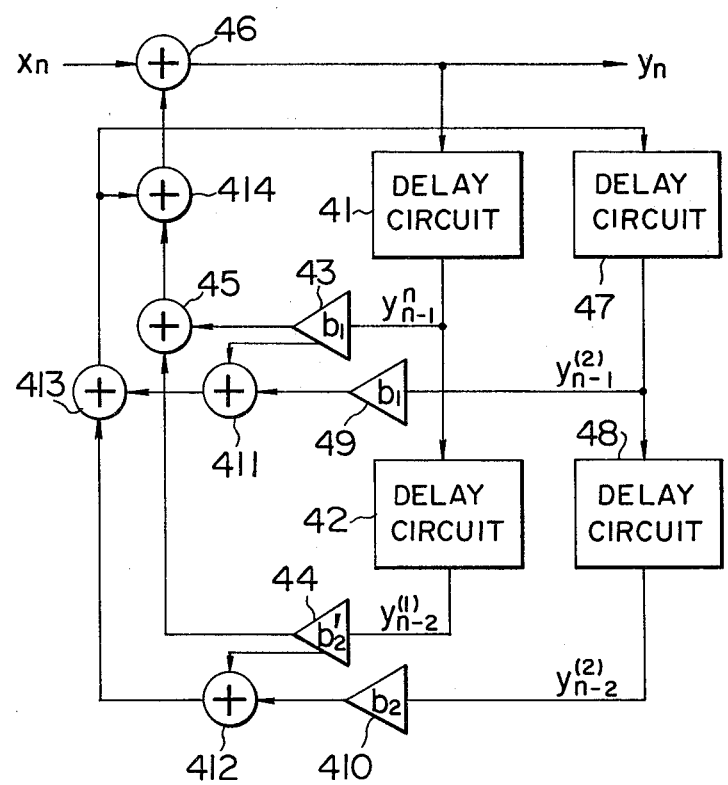
FIG. 7 shows a schematic circuit of still another embodiment in accordance with the invention.

Referring to FIG. 7, there is shown still another embodiment of the invention. In this embodiment, the invention is applied to a quadratic RDF incorporating multiplies, in place of the combinatorial type RDF, to prove that the application of the invention is not limited to the combinatorial type. As diagramatically illustrated in the figure, this embodiment comprises delay registers 41 and 42, coefficient multipliers 43 and 44, adders 45 and 46, additional delay registers 47 and 48 which are incorporated according to the invention, coefficient multipliers 49 and 410, and adders 411, 412, 413 and 414. The components 41 to 46 are involved in the conventional quadratic RDF. Letting m be the number of bits of the registers 41 and 42, the multiplication by the coefficient of l bits results in the calculation result of (m+l) bits and this calculation result exceeds the receiving capacity of the register of m bits. Accordingly, the registers 47 and 48 are adapted to hold and delay the round off data and are operated in parallel. Thus, the lower bits of the calculation result can be subjected to a calculation (multiplication and addition of the coefficient) similar to that for the higher bits so that when the bit carry occurs, this bit carry is fed to the adder 414. In this manner, it is possible to increase the number of data for the feedback registers (delay elements) without changing the clock rate. The number of bits of the delay registers 47 and 48 need not always be m but may be determined in compliance with the intended attenuation of the round off noise.

Although having been described by way of preferred embodiments as applicable to the 2nd order/2nd order or quadratic RDF, the invention may also be applicable to all types of RDF including 1st order/1st order, linear and cubic RDFs. Also, when, in the case of the combinatorial type RDF, the digital output signal is intended to be in the form of a linear format, it is not always necessary to provide the serial type delay circuit acting as the one sampling period delay element. Therefore, it should be understood that at least a partial signal either of the delayed digital output signal or of the most significant bit of the round off signal which are to be delayed in accordance with the invention may stand for, in the combinatorial type RDF, the output of the parallel-serial conversion means (parallel-serial conversion register) or the output of the serial delay element itself.

As will be seen from the foregoing description, in contrast to the prior art circuit arrangement wherein in order to improve decrease in S/N ratio due to round off noise and overflow, it is necessary to keep clear of RDF clocks of power of two or to double the number of RDF clocks with the result that the number of RDF clocks differs from the number of clocks for the input data or for peripheral equipments externally of the RDF, thus requiring the provision of the clock converter or increase in the amount of hardware on the output side, the invention can eliminate all the prior art disadvantages and provide the RDF capable of improving the S/N ratio, attaining a S/N ratio of 80 to 85 dB.

What we claim is:

1. In a recursive-type digital filter having a calculating means for calculating an output signal $y_n$, and a first means for supplying said calculating means with at least an m-bit input signal $x_n$ of $$\sum_{k=0}^{M} x_{n-k}$$

one bit by one bit; and second means including a data conversion means which cooperates with said calculating means to delay by one sample period said output signal $y_n$, and a feedback means for feeding back one bit by one bit to said calculating means at least an m-bit output signal $y_{n-1}$ of $$\sum_{k=1}^{N} y_{n-k}$$

wherein M and N are positive integers which represent a delay of the signal transmission and wherein the respective signals received by said calculating means from said first and said feedback means are multiplied by corresponding weighting coefficients $a_k$ and $b_k$ in order to produce at every sampling period a (m+1)-bit data $y_n$ satisfying, $$y_n = \sum_{k=0}^{M} a_k x_{n-k} + \sum_{k=1}^{N} b_k \cdot y_{n-k}$$

and $a_k$ and $b_k$ represent coefficients with $a_M$, $b_N \neq 0$ with the upper m-bits of said data $y_n$ being serially outputted as an output signal corresponding to said input signal $x_n$ from said filter, wherein the improvements comprises:

third means including a second data conversion means which cooperates with said calculating means to delay by one sampling period at least one of the lower l bits of said data $y_n$ and outputting a $y'_{n-1}$ signal, and fourth means receiving said $y'_{n-1}$ signal and outputting one bit by one bit to said calculating means a $y'_{n-k}$ signal so that said calculating means supplements said $y_n$ data by adding the product of said $b_k$ coefficient and the signal received from said fourth means, whereby said $y'_{n-k}$ signal, which is delayed by $k$ sampling periods from said input signal $x_n$, reduces round off errors.

2. A recursive-type digital filter according to claim 1, wherein said first means comprises a first circuit for supplying said input signal $x_n$ direct to said calculating means, and a second circuit including at least first signal delaying means for delaying said input signal $x_n$ by k sampling periods and means for supplying the output signal of said first signal delaying means to said calculating means.

3. A recursive-type digital filter according to claim 1 or 2, wherein said feedback means comprises a third circuit for feeding back direct to the input of said calculating means the m-bit output signal of said second means, and a fourth circuit including at least second signal delaying means for delaying the m-bit output signal of said second means by k sampling periods and means for feeding back to the input of said calculating means an output signal from said second signal delaying means, and said fourth means comprises a fifth circuit for feeding back direct to said calculating means an output signal from said third means, and a sixth circuit including third signal delaying means for delaying the output signal of said third means by k sampling periods and means for feeding back to the input of said calculating means an output signal from said third signal delaying means.

4. A recursive-type digital filter according to claim 3, wherein said calculating means comprises memory means for storing in advance data representing a sum of the products of the respective signals and the corresponding $a_k$ and $b_k$ coefficients with respect to all combinations of the signal status inputted one bit by one bit from said first, feedback and fourth means, so as to allow said data to be read out by addressing with said respective signals, and a calculator for shifting one bit by one bit the data read out from said memory means and summing the outputs of said memory means at every sample period thereby to output a parallel data $y_n$ of (m+1) bits.

5. A recursive-type digital filter according to claim 4, wherein said memory means comprises a read only memory.

6. A recursive-type digital filter according to claim 4, wherein said memory means comprises a first memory addressable with with the output signals of said first and feedback means for delivering an output data representing a sum of the products of those output signals and the corresponding $a_k$ and $b_k$ coefficients, and a second memory addressable with the output signal of said fourth means for delivering output data representing a sum of the products of the signal and the corresponding $b_k$ coefficient.

7. A recursive-type digital filter according to claim 6, wherein said fourth means comprises means for delivering an output signal $y'_{n-k}$ for addressing said second memory in synchronism with the first addressing of said first memory at every sampling period, and said calculating means comprises means for selecting an input signal to said calculator so that the first read-out data from said first memory at every sampling period is added to output data from the second memory and then the succeeding read-out data from said first memory is added to the calculation result already made.

8. A recursive-type digital filter according to claim 6, wherein said first and second memories each comprise a read only memory.

9. In a recursive-type digital filter having a calculation means for outputting an m-bit output signal $y_n$ and a first circuit for supplying a digital signal $x_n$ of m bits one bit by one bit to said calculation means, said digital signal $x_n$ being one which is sampled at a predetermined period, and a second circuit connected to said calculation means for delaying the signal $y_n$ by at least one sampling period and feeding back the delayed signal $y_{n-k}$ to said calculation means, said calculation means comprising a first multiplier for multiplying said $y_{n-k}$ signal by a $b_k$ coefficient of bits in accordance with the characteristics of said filter and providing (m+1)-th bit data, and a first adder for adding to said input signal $x_n$ the upper m bits of said (m+1) bit data from said first multiplier, thereby to produce serially the data $y_n$ having the upper m bits in accordance with said input signal $x_n$ and satisfying, $$\left[ Y_n = X_n + \sum_{K=1}^{N} b_k \cdot Y_{n-k} \right] \quad y_n = x_n + \sum_{k=1}^{N} b_k \cdot y_{n-k}$$

where N is a positive integer which represents a delay of the signal transmission, and $b_k$, $b_N \neq 0$, wherein the improvement comprises second calculation means for receiving at least one of the lower l-bits of said (m+1) bit data outputted from said first multiplier and outputting a signal $y'_n$, a third circuit connected to said second calculation means for delaying said signal $y'_n$ by at least one sampling period and feeding back the delayed signal $y'_{n-k}$ to said second calculation means, said second calculation means comprising a second multiplier for multiplying said $y'_{n-k}$ signal by said $b_k$ coefficient, a second adder means for adding the lower m bits of the output of said first multiplier and the output of said second multiplier to produce said signal $y'_n$ and means for supplying the carry part of the output of said second adder to said first adder so that the carry part is added to said input signal $x_n$ together with the output of said first multiplier.

* * * * *